United States Patent [19]

Sheng et al.

[11] Patent Number: 4,994,404
[45] Date of Patent: Feb. 19, 1991

[54] METHOD FOR FORMING A LIGHTLY-DOPED DRAIN (LDD) STRUCTURE IN A SEMICONDUCTOR DEVICE

[75] Inventors: David Y. Sheng; Yasunobu Kosa, both of Austin; Andrew J. Urquhart, Pflugerville; Mark J. Cullen, Austin, all of Tex.

[73] Assignee: Motorola, Inc., Schaumburg, Ill.

[21] Appl. No.: 399,670

[22] Filed: Aug. 28, 1989

[51] Int. Cl.[5] .................. H01L 21/312; H01L 21/265
[52] U.S. Cl. ...................................... 437/44; 437/27;
437/28; 437/29; 437/30; 437/41; 357/23.3;
156/643; 156/646
[58] Field of Search .................. 437/27, 28, 29, 30,
437/34, 56, 57, 41, 44, 235; 357/23.3; 156/643,
646, 659.1

[56] References Cited

U.S. PATENT DOCUMENTS

| | | | |
|---|---|---|---|
| 4,590,663 | 5/1986 | Haken | 437/34 |
| 4,642,878 | 2/1987 | Maeda | 437/34 |
| 4,728,617 | 3/1988 | Woo et al. | 437/44 |
| 4,740,484 | 4/1988 | Norström | 437/44 |
| 4,744,859 | 5/1988 | Hu et al. | 437/29 |
| 4,764,477 | 8/1988 | Chang et al. | 437/44 |
| 4,838,991 | 6/1989 | Cote et al. | 156/643 |
| 4,855,247 | 8/1989 | Ma et al. | 437/44 |
| 4,876,213 | 10/1989 | Pfiester | 437/34 |
| 4,886,765 | 12/1989 | Chen et al. | 437/44 |

OTHER PUBLICATIONS

Tsang et al., "Fabrication of High-Performance LDDFET's With Oxide Sidewall-Spacer Technology", IEEE Trans. on Electron Devices, vol. ED-29, No. 4, Apr. 1982, pp. 590-596.
Pfiester, "LDD MOSFET's Using Disposable Sidewall Spacer Technology", IEEE Electron Device Letters, vol. 9, No. 4, Apr. 1988, pp. 189-192.
Wolf et al., Silicon Processing for the VLSI Era, vol. 1-Process Technology, Lattice Press, 1986, pp. 428-434 and 564-565.

Primary Examiner—Olik Chaudhuri
Assistant Examiner—M. Wilczewski
Attorney, Agent, or Firm—Jasper W. Dockrey

[57] ABSTRACT

A process is disclosed for the formation of an LDD structure in an MOS transistor having a reduced mask count and providing high integrity source/drain junctions. In accordance with one embodiment of the invention an MOS transistor is formed having a gate dielectric overlying an active region of the substrate. A transistor gate is formed in a central portion of the active region and an oxidation layer is formed over the active region and the transistor gate. A lightly-doped source/drain region is formed which is self aligned to the transistor gate. A conformal layer of an oxygen reactive material is formed overlying the transistor gate and the active region. The oxygen reactive material is anisotropically etched in a oxygen plasma reactive ion etch to form a sidewall spacer on the edge the transistor gate. The oxygen reactive ion etch does not penetrate the oxidation layer overlying the active region. A heavily-doped source/drain region is formed which is self aligned to the edge of the sidewall spacer. The sidewall spacer is then removed completing the LDD structure.

2 Claims, 3 Drawing Sheets

METHOD FOR FORMING A LIGHTLY-DOPED DRAIN (LDD) STRUCTURE IN A SEMICONDUCTOR DEVICE

BACKGROUND OF THE INVENTION

This invention relates generally to a process for fabricating semiconductor devices and more specifically to a process for forming LDD NMOS and CMOS devices.

MOS transistors with channel lengths of 1.5 microns or less are prone to a well documented problem known as hot carrier injection. The problem occurs as a result of a large electric field developed in the substrate near the drain region when the transistor is operated in a saturated condition. The large electric field at the drain edge provides sufficient potential to force carriers into the transistor gate dielectric. The injected carriers increase the amount of trapped charge in the gate dielectric and change the charge distribution causing a shift in the threshold voltage. The problem is much more severe in n-channel transistors than in p-channel transistors because of the high electron mobility and the surface channel aspect of the NMOS transistor. Over a period of time the amount of trapped charge in the gate dielectric increases as the transistor is repeatedly brought to a condition of saturation. Eventually, the threshold is shifted to a point where the transistor can no longer be controlled by applying voltage to the gate electrode, and the circuit fails.

One solution to the problem of carrier injection is to form a lightly-doped drain (LDD) structure. The LDD structure consists of lightly-doped source/drain regions adjacent to the gate with heavily-doped source/drain regions laterally displaced from the gate electrode. The lightly-doped region is diffused just under the gate dielectric and produces a smaller electric field near the drain edge, thus reducing carrier injection into the dielectric. The heavily-doped source/drain region provides a low resistance region where an ohmic contact can be made.

In order to be manufactured in an efficient manner it is necessary that the process of forming the LDD structure be compatible with the self-aligned transistor gate fabrication technique. To achieve this compatibility, sidewall spacers are formed on the side of the gate to space the heavily-doped source/drain regions a prescribed distance away from gate electrode without using a critical photolithographic alignment step. The process typically involves lightly implanting the active region through an overlying dielectric layer using the gate as a hard mask. The sidewall spacer is formed by depositing a conformal layer of sidewall spacer forming material overlying the gate electrode. The sidewall spacers are formed by anisotropically etching the spacer forming material to leave the material on all vertical edges including the edges of the gate electrodes. The spacers thus formed are used as an ion implantation mask to displace the heavily-doped region a distance away from the gate electrode with the lateral distance being determined by the deposited thickness of the spacer forming material.

Various approaches to the LDD formation process have appeared in the prior art. For the most part these methods have been directed to reducing the number of photomasking steps required to form the structure in a CMOS process. The prior mask reduction methods usually employ an additional oxidation step. For example, Solo(de Zaldivar) in U.S. Pat. No. 4,420,872, oxidizes the polysilicon gate electrode to form a sidewall spacer. This process has the disadvantage of enlarging the thickness of the gate dielectric layer near the edge of the gate electrode. The encroachment of the sidewall spacer under the gate shortens the gate electrical field and disrupts the alignment of the source/drain regions with the gate edge.

Another mask reduction technique described by Parrillo et al, in U.S. Pat. No. 4,753,898 reverses the order of the implant steps in a CMOS process by first forming a heavily-doped NMOS source/drain region, then uses the heavily-doped layer to enhance the growth of a protective oxide over the source/drain. The thick oxide protects the NMOS source/drain from the implant used to form the source/drain region for the PMOS transistor. This method can induce the problem of an unwanted redistribution of impurity atoms during the oxidation process. The diffusion of impurity atoms away from the surface of the silicon substrate reduces the surface concentration of the impurity thus compromising the formation of the necessary ohmic contact to the source/drain region.

The methods described above are also characteristic of LDD formation methods that use a sidewall spacer forming material which must be anisotropically etched by a gaseous plasma mixture of reactive chemical agents. The spacer forming material is typically a deposited silicon dioxide, silicon nitride, or polycrystalline silicon (polysilicon). The chemical agents used in the prior art to etch films of this type comprise compounds of halogenated hydrocarbons, molecular halogens such as fluorine and chlorine, and hydrogenated halogens. These agents are used singularly or in varying combinations to anisotropically etch the spacer forming materials previously described. One problem with this technique is that these etchants used to form the sidewall spacer will also attack single crystal silicon in the source/drain areas of the substrate during the etching of the spacer forming material.

Typically the etching of the spacer forming material is carried out for a period of time longer than that which is necessary to just remove the spacer material from all horizontally disposed surface. This is known as an overetch, or overetching, and is commonly employed to completely remove spacer forming material from areas of the substrate having high topographical contrast. The complete removal of excess material is necessary to avoid unwanted masking of the ion implant used to form the heavily-doped source/drain region.

The problem of etchant attack in the source/drain areas can also occur during the process of removing the sidewall spacers prior to further processing of an MOS device. In this instance, an isotropic etch is performed that etches in all directions at the same rate. The same chemical agents described previously are again used for the isotropic etch. The surface of the source/drain region is exposed for the entire duration of this etch process providing ample opportunity for the etchants to pit the surface.

The etchants penetrate the dielectric layer overlying the source/drain region and attack the silicon substrate during the process of overetching the spacer forming material, and etching to remove the spacer after formation of the lightly-doped drain. The attack on the silicon often occurs because the gasses selected to etch the spacer forming material also react with, and etch, the underlying dielectric material at nearly the same rate.

This is known in the art as a non-selective etch. The selectivity of an anisotropic reactive ion etch is determined by the ratio of the etch rate of the material to be etched to that of the underlying material. The reactive gasses selected for the reactive ion etch used to form a sidewall spacer must yield as high of etch selectivity as possible with respect to the underlying dielectric layer. In the case of anisotropically etching a spacer forming material such as silicon dioxide, obtaining high selectivity to an underlying dielectric material (often thermally grown silicon dioxide) is extremely difficult.

The scaling of circuit dimensions to smaller values has resulted in a progressive reduction in source/drain junction depths in the silicon substrate. The reduced junction depth, 0.15 microns in the case of some high performance VLSI memory devices, makes the transistor more susceptible to defect induced performance degradation. Surface defects can thread through such shallow junctions. The penetration of the overlying dielectric layer, and the subsequent attack on the substrate during the overetch, can create substrate defects in the source/drain region. Etchant pitting of the silicon creates a rough surface and disturbs the silicon crystal lattice causing the formation of dislocations in the silicon lattice. The removal of the overlying dielectric layer exposes the surface to metal contaminants sputtered from the reactor chamber surfaces during the etch. These defects act as precipitation sites for impurities in a process known as gettering. The defects thus formed can thread through the source/drain junction causing current leakage between the source/drain region and the substrate, which is known as source/drain junction leakage. In normal transistor operation a bias voltage is applied to the substrate such that the source/drain junctions are reversed biased. This biasing condition cannot be adequately maintained if current leaks through the junction. The presents of a continuous drain current introduces drain voltage instability which leads to poor data retention in a static memory device such as an SRAM.

The fabrication of defect free transistors with LDD structures becomes increasingly important as circuit geometries are scaled to smaller dimensions. The smaller transistor gate lengths and high operating supply voltages that make LDD structures necessary demand very shallow source/drain junction depths in order to meet scaling requirements. Accordingly, a need existed for an improved process for the formation of an LDD structure using a side wall spacer forming material which can be reliably etched without causing source/drain junction leakage. A further need existed for a process with a reduced number of photomasking steps, in both an NMOS and a CMOS process, that does not compromise the integrity of the gate dielectric or the doping uniformity of the lightly and heavily-doped source/drain regions.

BRIEF SUMMARY OF THE INVENTION

An object of the present invention is to provide an improved process for forming an LDD structure in a semiconductor device.

Another object of the present invention is to provide an improved process for forming an LDD structure that minimizes source/drain junction leakage.

Yet another object of the present invention is to provide an improved process for forming an LDD structure using a reduced number of photolithography masking steps.

A further object of the present invention is to provide an improved process for forming CMOS LDD structures which reduces the number of photomasking steps.

The foregoing and other objects and advantages of the invention are achieved, in one embodiment, by an LDD process which yields minimized source/drain junction leakage and achieves a reduction in the number of photomask steps and furthermore preserves the integrity of the doping profile of source/drain regions. In accordance with that embodiment a semiconductor substrate of a first conductivity type is provided having an active region bounded by a first and a second isolation region. A thin dielectric layer is formed to overlie the active region and a transistor gate electrode is formed in the active region. An oxidation layer is formed to overlie the active region and the transistor gate. A lightly-doped impurity region of a second conductivity type is formed in the active region using the gate electrode and the first and second isolation region as a dopant mask. A conformal layer of an oxygen reactive material is formed to overlie the gate electrode and the substrate regions. The conformal layer is etched by oxygen plasma reactive ion etching to form a sidewall spacer overlying the vertical edges of the gate electrode. The reactive ion etch does not remove the oxidation layer overlying the source/drain regions formed in the active region. A heavily-doped impurity region of a second conductivity type is then formed in the active region using the side wall spacer and the first and the second isolation regions as a dopant mask. The side wall spacers are then removed by an isotropic oxygen plasma etch.

DETAILED DESCRIPTION OF THE PREFERRED EMBODIMENTS

Figure 1:
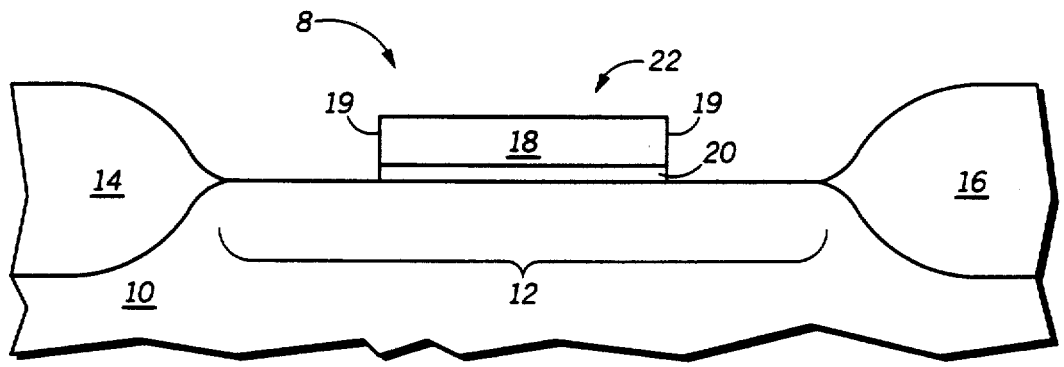
FIGS. 1 through 7 illustrate, in cross section, process steps in accordance with the preferred embodiment of the invention.

Shown in FIG. 1, in cross section, is a portion 8 of a semiconductor device which has already undergone some of the process steps of the prior art used in the fabrication of an integrated circuit. The portion 8 of FIG. 1 comprises a silicon substrate 10, of a first conductivity type, having an isolation region 14 and an isolation region 16 separated by an active region 12. A transistor gate electrode 18, having a vertical surface 19 and overlying a thin dielectric layer 20, is located in a central portion of active region 12. Gate electrode 18 is bounded by vertical surface 19 and adjoins active region 12. The device components illustrated in FIG. 1 comprise portions of an n-channel MOS transistor 22 in an integrated circuit prior to the formation of the source and drain regions of the transistor. Isolation regions 14 and 16 provide electrical isolation between transistor 22 in active region 12 and adjacent transistors, which for convenience are not shown.

Figure 2:
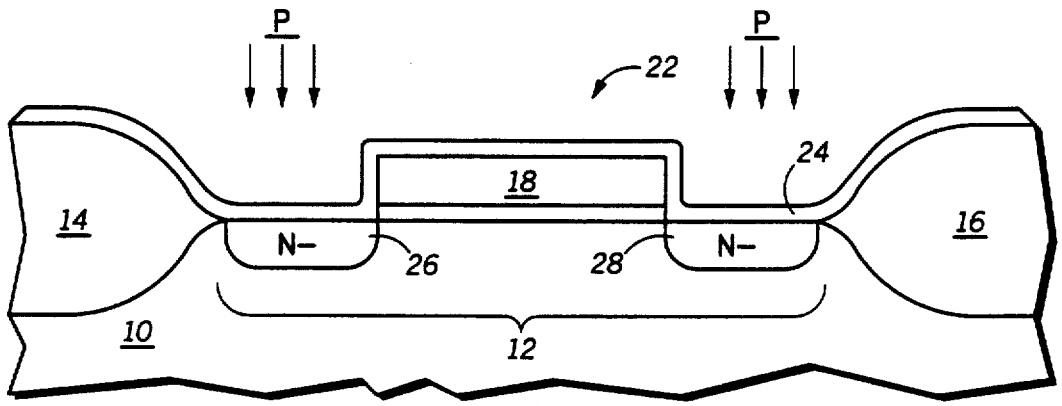

The process continues with the formation of an oxidation layer 24 overlying substrate 10 as shown in FIG. 2. Oxidation layer 24 serves to protect active region 12 from contamination during subsequent processing and to provide an intermediate layer between gate 18 and sidewall spacers to be formed thereon. Oxidation layer 24 is formed by thermal oxidation, or deposition of a conformal material such as silicon dioxide. This is well known in the art.

After forming oxidation layer 24, lightly-doped regions 26 and 28 are formed in active region 12, as shown FIG. 2. The dopant is of a second conductivity type which is different from that of substrate 10 and is introduced in the substrate by ion implantation to a dosage of about $5 \times 10^{13}$ per $cm^2$. The dopant species is selected from the group of donor elements such as phosphorus or arsenic. The lightly-doped regions 26 and 28, also labeled N— in FIG. 2, are self-aligned to active region 12 by using isolation regions 14 and 16, and gate 18 as a dopant mask. The formation of lightly-doped regions 26 and 28 comprise the first doping step in the formation of the source and drain regions of transistor 22. The fabrication of the source and drain regions is to be carried out in such a manner as to form a lightly-doped region in close proximity to gate 18 and a more heavily-doped region between isolation regions 14 and 16 and the lightly-doped region. This doping configuration is known in the art as a lightly-doped drain (LDD) structure.

Figure 3:
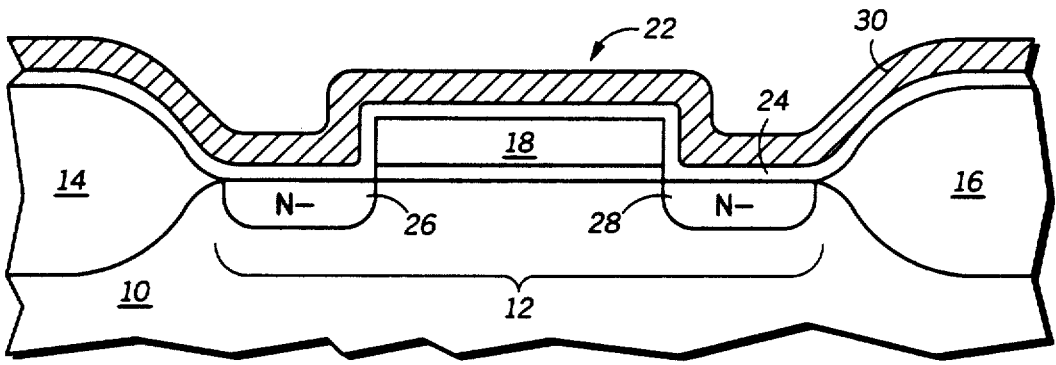

Once the lightly-doped region has been formed, a conformal layer 30 of an oxygen reactive material is formed to overlie substrate 10, as shown in FIG. 3. In accordance with one embodiment of the invention, the material is preferably a carbonaceous conformal material, such as amorphous carbon or an organic polymer, which is reactive with molecular or atomic oxygen. For example, in the preferred embodiment the material is amorphous carbon which is deposited by plasma enhanced chemical vapor deposition (PECVD). Additionally conformal layer 30 may, for example, be deposited by non-plasma chemical vapor deposition (CVD). Alternatively, conformal layer 30 may be formed by application to substrate 10 as a spray dispensed liquid emulsion polymer and then spread evenly across substrate 10 by rapid rotation of substrate 10. Conformal layer 30 is deposited to a thickness that depends upon the desired lateral width of the lightly-doped portion of the LDD structure. In the preferred embodiment, conformal layer 30 is deposited to a thickness of about 200 to 300 nanometers.

Figure 4:
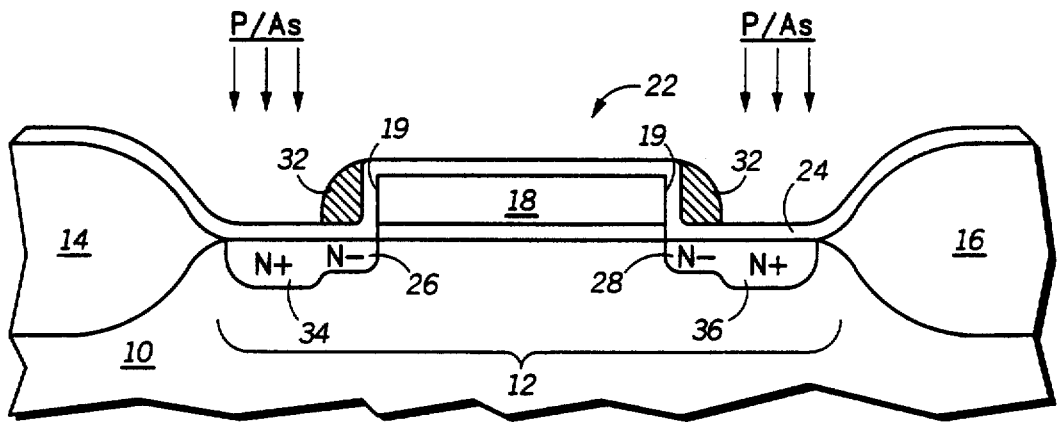

Conformal layer 30 is anisotropically etched, such as by oxygen plasma reactive ion etching (RIE), to form a sidewall spacer 32 as illustrated in FIG. 4. An anisotropic etch is an etch that proceeds in the vertical direction much more rapidly than in the horizontal direction. The nature of the anisotropic etching of conformal layer 30 is such that a portion of layer 30 remains on vertical surface 19 to form sidewall spacer 32. Sidewall spacer 32 is continuous and contiguously bounds oxidation layer 24 overlying vertical surface 19. In order to form sidewall spacer 32 a certain amount of etching is required beyond that which would just remove layer 30 from all horizontally displaced surfaces of substrate 10. This overetching removes residual material in areas of the substrate having high topographic contrast, but because it is an anisotropic etch and the conformal material overlying a vertical edge is necessarily thicker than that overlying a horizontal surface, any material overlying a vertical surface is essentially not etched, or only etched at a very slow rate.

The oxygen employed in the reactive ion etch process is highly reactive with the carbonaceous material comprising layer 30, but does not react, to an appreciable extent, with non-carbonaceous material such as oxidation layer 24. For example, it is well known in the prior art that oxygen plasma reactions can be used to selectively remove photoresist films overlying material such as silicon dioxide, silicon nitride, and polysilicon. The use of an oxygen RIE in combination with insulating layer 24 minimizes the creation of defects in the silicon surface of active region 12. The oxygen RIE leaves a microscopically smooth surface free from pitting and discoloration. Prior art processes of etching a silicon dioxide material to form a sidewall spacer use etchant species which react with single crystal silicon, creating a rough, pitted surface in the active region.

After the sidewall spacer is formed heavily-doped regions 34 and 36 are formed in active region 12 using sidewall spacer 32 and isolation regions 14 and 16 as a doping mask. A donor species is selected such as phosphorus or arsenic and ion implanted with an implant dose about three orders of magnitude larger than that used to form the N— region. As illustrated in FIG. 4 the heavily-doped regions 34 and 36, also designated as N+, are located in substrate 10 on either side of sidewall spacer 32 and bounded by isolation regions 14 and 16. The dopant forming the N+ region is introduced by ion implantation or other means and forms an impurity region to a depth of about 0.15 microns in the active region of substrate 10.

Figure 5:
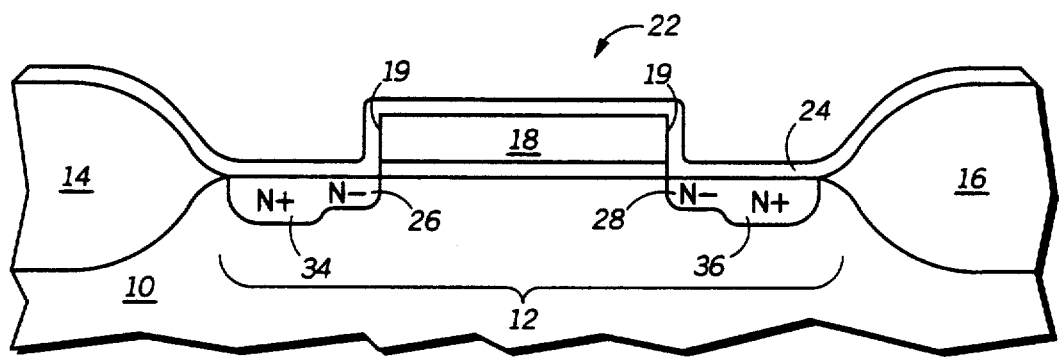

The LDD structure is completed, as shown in FIG. 5, with the removal of sidewall spacer 32 by means of an isotropic oxygen plasma etch. The isotropic oxygen plasma etch is characteristic in that the reaction rate is the same in both the horizontal direction and the vertical direction thus the etch removes the oxygen reactive material comprising sidewall spacer 32 from all vertical surfaces.

A particular advantage of forming a sidewall spacer with an organic polymer material, as described by one embodiment of the present invention, is that this material can be applied over an organic film, such as a photoresist pattern already present on the substrate because it shares common physical parameters of substrate temperature and hydration with the known process of applying a photoresist film. For example, a novolac resin type photoresist after pattern development will undergo an undesirable physical deformation at about 120 degree centigrade. The prior art process for forming a side wall spacer, wherein a silicon dioxide spacer forming material is deposited by a low temperature oxide (LTO) deposition process, takes place at temperatures in excess of 300 degrees centigrade. Processes of this type cannot be carried out with a photoresist material such as a novolac resin overlying the substrate. As will be described in the following this process compatibility permits a reduction in the number of masking layers necessary to form the LDD structure.

Prior art process sequences used to form LDD structures, employing an LTO, polysilicon, or silicon nitride sidewall spacer, usually require two separate applications of a photoresist masking layer. The requirement for two photoresist masking layers arises from the need to protect peripheral circuit elements from contact with the dopant used to form the N— and the N+ regions, in the active area of the NMOS transistor, and the relatively high temperatures employed during deposition of a silicon dioxide film. The photoresist pattern, protecting the peripheral circuitry during formation of the N— region, must be removed before subjecting the substrate to the high temperatures of silicon dioxide deposition. After etching the silicon dioxide film to form the sidewall spacer, a photoresist pattern must be reapplied to protect the peripheral circuitry from the doping process used to form the N+ region.

Figure 6:
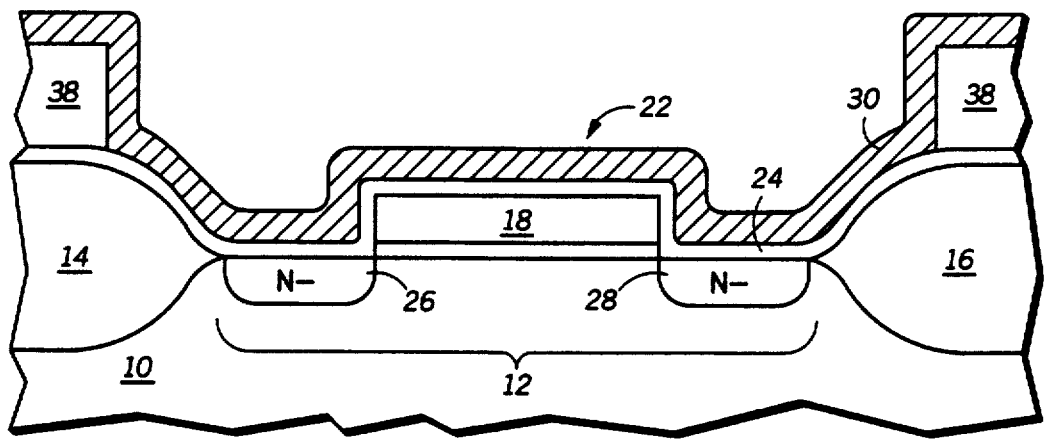
Figure 7:
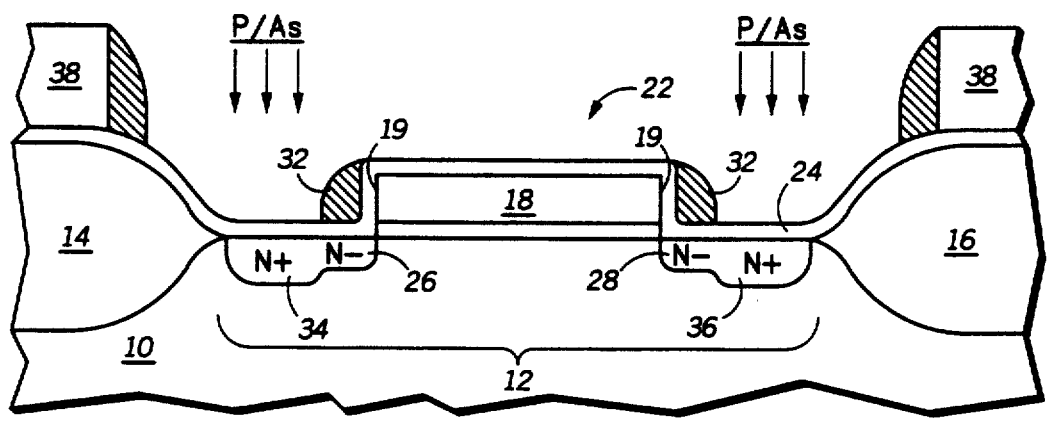

The protection of peripheral circuitry, in the process sequence described in the preferred embodiment, can be accomplished by first forming a photoresist pattern 38 over the peripheral circuitry prior to performing the N− implant as shown in FIG. 6. The process then proceeds with the application of layer 30 over all surfaces of substrate 10 including photoresist pattern 38. Layer 30 is etched to form sidewall spacer 32 and then heavily-doped N+ regions 34 and 36 are formed, as shown in FIG. 7. Following formation of regions 34 and 36, sidewall spacer 32 is removed by an isotropic etch which will also remove photoresist pattern 38 on substrate 10. The LDD formation process of the present invention is accomplished with the formation of one photoresist layer to protect peripheral circuitry from LDD doping cycles. Thus it is apparent that the inventive process has resulted in a reduction of the necessary steps to form an LDD structure.

The process simplification described above becomes even more advantageous when the invention is applied to a CMOS fabrication process. The reduction of necessary masking layers obtained by using the inventive process for the fabrication of an NMOS transistor is doubled when applied to a CMOS fabrication process. This occurs because both an n-channel and a p-channel transistor are being formed in the CMOS process, which require different doping species to form the LDD structures of each transistor. One transistor must be protected, either the n-channel or the p-channel, while the LDD structure is being formed for the transistor of opposite conductivity. In the conventional CMOS fabrication process, using silicon dioxide sidewall spacers, four separate applications of a photomasking layer must be made.

Thus it is apparent that there has been provided, in accordance with the invention, an improved process for forming an LDD structure which fully meets the objects and advantages set forth above. Although particular embodiments of the invention have been described in the foregoing description, it will be apparent to one skilled in the art that numerous modifications and variations can be made to the presented embodiments which still fall within the spirit and scope of the invention. For example, the sequence of process steps may be changed to form the heavily-doped region first, then remove the sidewall spacer and form the lightly-doped region. Accordingly, it is intended that all such variations and modifications as fall within the scope of the appended claims be included within the invention.

We claim:

1. A method for forming a lightly-doped drain in a semiconductor device comprising the steps of:

providing a semiconductor substrate of a first conductivity type and having an active region intermediate to a first and a second isolation region;

forming a thin dielectric layer overlying said active region;

forming a transistor gate in a central portion of said active region overlying said dielectric layer, said gate having horizontal surface and bounded by a vertical surface;

forming an oxidation layer to overlie said active region and said transistor gate;

forming a lightly-doped impurity region of a second conductivity type in said active region using said gate and said first and second isolation regions as a doping mask;

depositing by plasma enhanced chemical vapor deposition a conformal layer of amorphous carbon to overlie said substrate;

anisotropically etching said conformal layer of amorphous carbon by oxygen plasma reactive ion etching to remove said layer from said horizontal surface and leave a portion of said amorphous carbon covering said vertical surface to form a sidewall spacer;

forming a highly doped impurity region of a second conductivity type in said active region using said sidewall spacer and said first and second active regions as a doping mask; and removing said sidewall spacer.

2. A method for forming a lightly-doped drain in a semiconductor device comprising the steps of:

providing a semiconductor substrate of a first conductivity type and having an active region intermediate to a first and a second isolation region;

forming a thin dielectric layer overlying said active region;

forming a transistor gate in a central portion of said active region overlying said dielectric layer, said gate having a horizontal surface and bounded by a vertical surface;

forming an oxidation layer to overlie said active region and said transistor gate;

forming a lightly-doped impurity region of a second conductivity type in said active region using said gate and said first and second isolation regions as a doping mask;

depositing by plasma enhanced chemical vapor deposition a conformal layer of amorphous carbon to overlie said substrate;

anisotropically etching said conformal layer of amorphous carbon to remove said layer from said horizontal surface and leave a portion of said amorphous carbon covering said vertical surface to form a sidewall spacer;

forming a highly doped impurity region of a second conductivity type in said active region using said sidewall spacer and said first and second active regions as a doping mask; and removing said sidewall spacer.

* * * * *